United States Patent [19]

de Chambost et al.

[11] Patent Number: 4,873,455

[45] Date of Patent: Oct. 10, 1989

[54] PROGRAMMABLE FERROELECTRIC POLYMER NEURAL NETWORK

[75] Inventors: Emmanuel de Chambost, Molieres; Francois Micheron, Gif Sur Yvette; Francois Vallet, Bagnolet; Jean-Michel Vignolle, Boug la Reine, all of France

[73] Assignee: Thomson-CSF, Paris, France

[21] Appl. No.: 254,805

[22] Filed: Oct. 17, 1988

[30] Foreign Application Priority Data

Oct. 9, 1987 [FR] France .................. 87 13961

[51] Int. Cl.⁴ ............... G06F 15/42; H04Q 9/00; G11C 11/22
[52] U.S. Cl. ................ 307/201; 340/825.79; 365/117
[58] Field of Search ........... 365/117; 340/166 FE; 307/201

[56] References Cited

U.S. PATENT DOCUMENTS

| | | | |
|---|---|---|---|
| 3,430,203 | 2/1969 | Crawford | 340/172.5 |
| 3,845,471 | 10/1974 | Reitbeock | 340/149 R |
| 4,169,258 | 9/1979 | Tannas, Jr. | 340/166 FE |
| 4,348,611 | 9/1982 | Ruppel et al. | 365/117 X |
| 4,518,866 | 5/1985 | Clymer | 307/201 |
| 4,620,262 | 10/1986 | Olsen | 361/323 |

FOREIGN PATENT DOCUMENTS

| | | |
|---|---|---|
| 0103170 | 3/1984 | European Pat. Off. |
| 0154263 | 9/1985 | European Pat. Off. |
| 0166938 | 1/1986 | European Pat. Off. |
| 2604283 | 3/1988 | France. |

*Primary Examiner*—Donald A. Griffin
*Attorney, Agent, or Firm*—Oblon, Spivak, McClelland, Maier & Neustadt

[57] ABSTRACT

The network comprises several memory elements made of ferroelectric polymer, arranged in a matrix organization at the intersections of row and column electrodes. Each memory element (Mij) memorizes a synaptic coefficient $a_{ij}$ of the network which may be restored by pyroelectric effect on the corresponding column of the network. Amplifier circuits, respectively connected to the columns, give a voltage which is equal to the sum, to which a sign is assigned, of the products of the synaptic coefficients by the voltage components applied to each of the lines of the network.

12 Claims, 6 Drawing Sheets

FIG_3
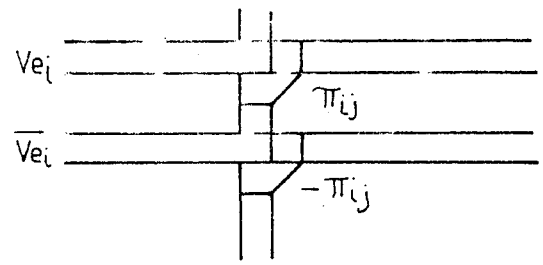
FIG_4-A
FIG_4-B
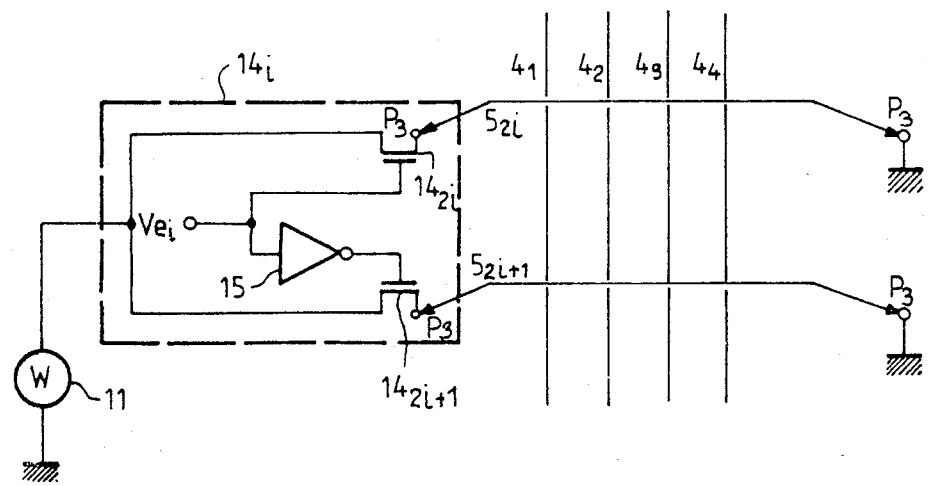

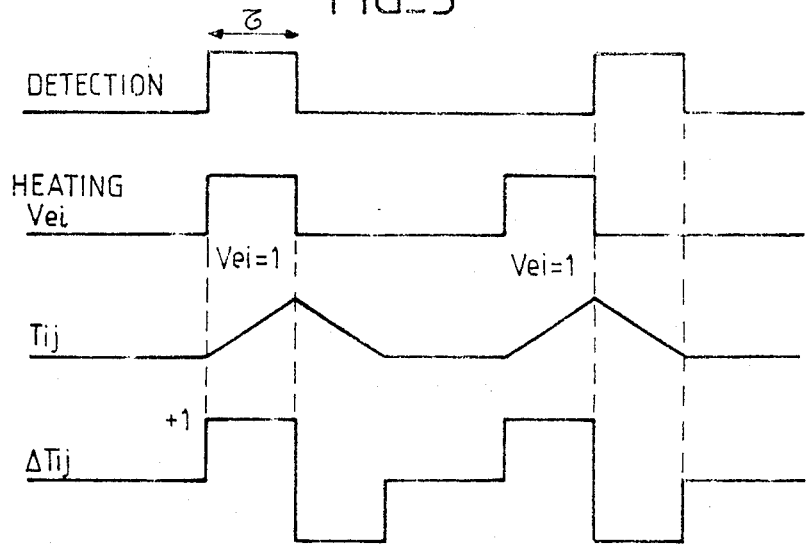
FIG_5
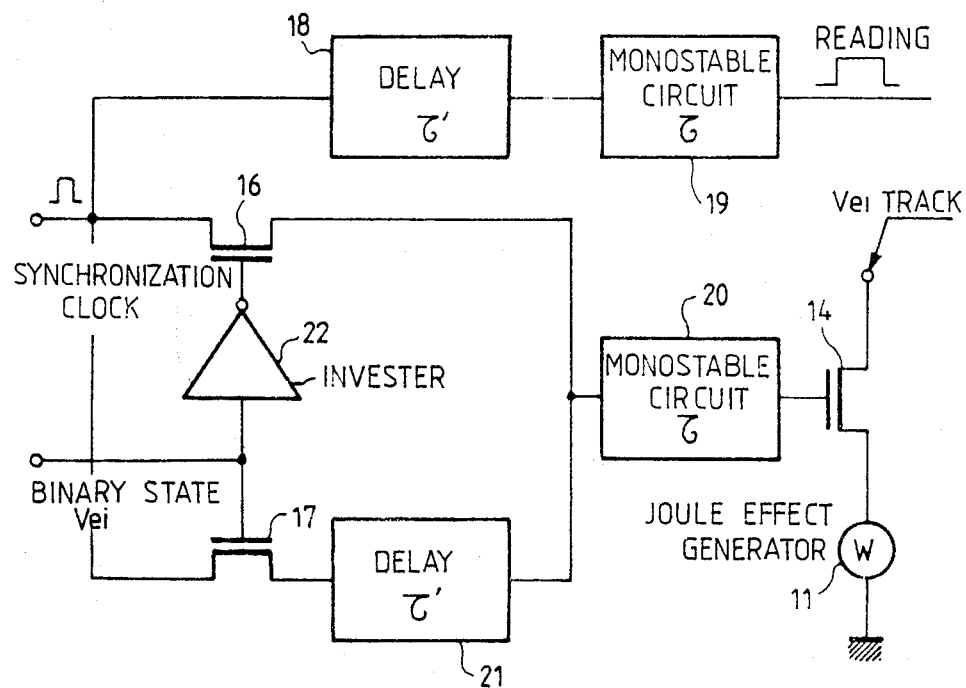
FIG_6

PROGRAMMABLE FERROELECTRIC POLYMER NEURAL NETWORK

BACKGROUND OF THE INVENTION

1. Field of the Invention

The present invention concerns a programmable ferroelectric polymer neural network.

2. Description of the Prior Art

The term "neural networks" in techniques relating to artificial intellegence, developed in the prior art, designates electrical circuits capable of performing conversions on vectors with a high number of components. Numerous exemplary embodiments of these circuits are known, for example, from the article, by J. J. Hopfield and D. W. Tank, "Neural Computation of Decisions in Optimization Problems" in *Biological Cybernetics* 52 141 152 (1985) and again from Hans P. Graf and Paul de Vegvar, "A CMOS Implementation of a Neural Network Model", AT & T Laboratories, Holmdel, N.J. 07733.

The object of these networks is to perform operations of the following type:

$$|Vs| = 1. |A_{ij}| |Ve|$$

where $|Ve|$ is an input vector with N components $V_{ei}$, such that $$V_{ei} \epsilon \{-1, +1\},$$

$|Vs|$ is an output vector with M components $V_{sj}$ such that $$V_{sj} \epsilon -1, +1$$

and where $|A_{ij}|$ is a matrix of N×N positive or negative coefficients.

1. $|A_{ij}|$ designates the operation which, at an input vector Ve, causes an output vector $V_s$ to correspond in such a way that:

$$V_{sj} = \text{sign}\left(\sum_{i=1}^{N} a_{ij} V_{ei}\right)$$

With the convention that
sign (n) = 1 si X > O
sign (n) = −1 si X < O

The coefficients $A_{ij}$ are called "synaptic coefficients" or "synaptic weights".

According to known embodiments, the operation:

$$\sum_{i=1}^{i=n} a_{ij} \cdot V_{ei}$$

is achieved similarly by means of an amplifier circuit with a very high gain connected to a network of resistors. The resistors of the network are connected, by one of their ends, to the input of the amplifier circuit, each coefficient $a_{ij}$ being represented by the value of a resistor of the network. Thus, a neural network is obtained consisting of a neurone formed by the amplifier circuit and synapses, formed by the resistors. Again, according to this configuration, the sign of each synaptic coefficient $a_{ij}$ can be defined by biasing, though a voltage +u or −u, the end of the resistor corresponding to this coefficient which is not connected to the input of the amplifier circuit.

The matrix operator can be obtained by associating, in the same way, several amplifiers with their network of resistors. However, this association is not very viable industrially when the number of components of vectors processed is very high, for example when it is more than a thousand. In these conditions, it is clear that even in using techniques for making the most advanced very large scale integrated circuits, it is not possible to integrate, on one and the same substrate, $10^6$ resistors with different values associated with 1000 amplifiers.

It is also clear that a purely digital solution to this problem cannot be appropriate because an ideal processor should be capable of processing $10^6$ operations per elementary computation cycle and because no processor can presently achieve this.

There is also a known memorizing device with polarizable ferroelectric elements described in the European patent No. 016 6938. As shown in FIG. 7, this document describes, in particular, a system for writing and reading in a memory of this type consisting of a layer 1 of an electrically polarizable material flanked by a set 2, 3, of parallel conductive strips $2_1, 2_2 \ldots; 3_1, 3_2, \ldots$, on its upper face and on its lower face. The two sets of conducting strips are set at 90° with respect to each other so as to form several points of intersection, each defining a storage cell 4.

The writing operation on a cell 4 is done by setting up a voltage between the row $3_3$ conducting strip and the column $2_4$ conducting strip. The reading operation is done by piezoelectrical or pyroelectrical effect. In the latter case, it is proposed, in particular, to set up heating current pulses in each conducting strip $3_1$ and to collect the signals induced by the corresponding cells, in parallel on each of the perpendicular conducting strips $2_1, \ldots 2_4$. All the cells can thus be explored by successive heating of each of the strips $3_1 \ldots 3_4$ under the control of a multiplexer 7.

This prior art device is far from being designed for or suited to the making of neural networks:

It cannot be used to introduce the values $V_{ei}$ of the components of the input vector Ve, nor to give the products $a_{ij} \cdot V_{ei}$;

it is not designed to perform adding operations used to obtain each of the components $V_{sj}$ of the resultant vector $V_s$.

SUMMARY OF THE INVENTION

An aim of the invention is to overcome the above-mentioned disadvantages and drawbacks.

To this end, an object of the invention is a programmable, ferroelectric polymer neural network wherein each synapse of the network comprises a ferroelectric polymer memory element to memorize a synaptic coefficient $a_{ij}$, in the form of an electrical charge $q_{ij}$, and wherein the memory elements $a_{ij}$ of one and the same column j are connected together by one and the same conductor to enable the flow of all the electrical charges generated by pyroelectrical effect at each memory element of the network when any part of all the memory elements of the column j is heated.

The main advantage of the invention is that it enables the making of artificial neurone networks by a simple application of known methods for making micro-electrical circuits. The ferroelectric polymer cubes bearing the different synapses are arranged matricially between two successive layers of neurones to enable the connection between these neurones. The information on the synaptic coefficients of these neurones is stored through the hysteresis cycle of the ferroelectric polymer and the pyroelectrical effect enables the summation of the states of all the input neurones weighted by the synaptic coefficients.

BRIEF DESCRIPTION OF THE DRAWINGS

Other features and advantages of the invention will be seen below from the following description, made with reference to the appended drawings, of which:

FIG. 3 shows a truth table of the multiplication operation $a_{ij}V_{ei}$ according to the invention;

FIG. 4 shows a duplication of the horizontal rows of the matrix organization of the memory to apply positive or negative synaptic coefficients;

FIG. 5 shows a timing diagram representing a mode of excitation of the memory elements without any duplication of horizontal tracks;

FIG. 6 shows an embodiment of a sequencer to generate the signals shown in FIG. 5;

DETAILED DESCRIPTION OF THE INVENTION

Figure 1:
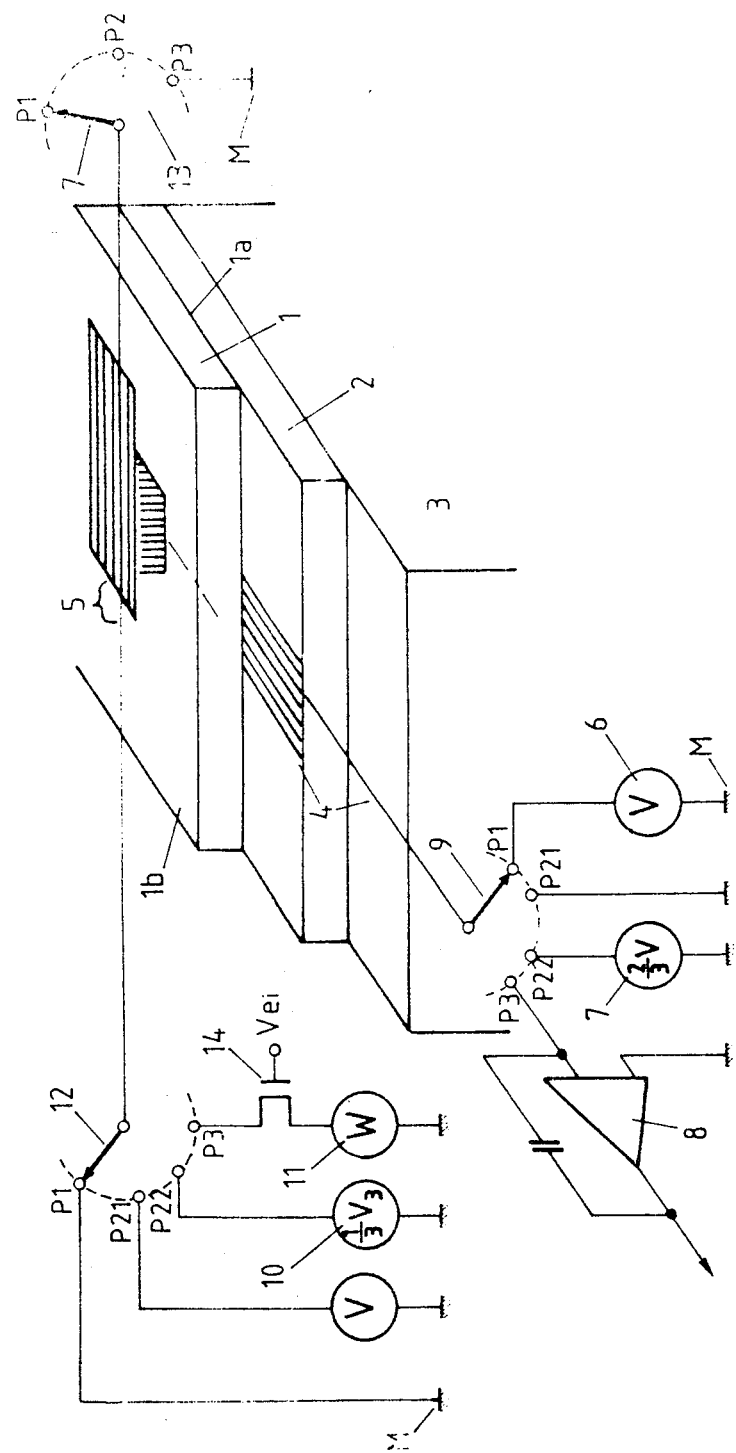
FIG. 1 shows the organization of a ferroelectric polymer memory element according to the invention.

The memory and connection element which is shown in FIG. 1 and is used as a basis for the matrix embodiment of a neural network according to the invention comprises a recording medium 1 formed by a thin layer of a ferroelectric polymer of the P (VF$_2$ TrFE) type coating a surface 2 of a previously oxidated silicon wafer 3. The thin layer 1 of polymer is deposited by a known method called "spin-coating". This method can be used to obtain polymer thicknesses of less than $10^{-6}$ meters and switch-over times, for the material in its hysteresis cycle, close to about 100 nanoseconds. Another advantage is that the thin layer thus obtained can be heated very quickly by a heat supply applied to the surfaces. Since the thermal diffusibility is $5.10^{-8} m^2 s^{-1}$ for these polymers, a propagation time of the thermal wave of about $5.10^{-6}$ s in the thickness of the material is obtained for a thickness of layer of $10^{-6}$ m.

The ferroelectric layer required to store information may consist of ferroelectric materials other than P(VF$_2$T$_r$FE) type polymers, inasmuch there are known methods to deposit these materials in thin layers, typically with a thickness of less than one micron so that the thermal diffusion time is not excessive and inasmuch as the electrical breakdown field is far greater than the coercive field.

This may be, in particular, the case with the group of ferroelectric materials known as LZT (lead, zirconate, titanate) and their derivates. The depositing techniques have been developed and perfected for the requirements of ferroelectric memories also called FERRAM. The process used to deposit these layers may be sputtering.

The electrode 4 is deposited by metallization or any equivalent process on the silicon oxide surface 2 so as to be in contact with a face 1a of the recording medium 1. The electrode 5 is deposited on the other face 1b parallel to the face 1a of the medium 1.

The electrode 4 is coupled to an erasing generator 6, a recording generator 7 and a reading amplifier 8 through a four-position change-over switch 9. The electrode 5 is coupled, by one end, to the ground circuit M, to a recording generator 10 and to a reading generator 11 through a four-position change-over switch 12 and, by its other end, to the reference ground circuit M of the potentials of the memory element through a three-position change-over switch 13. The coupling of the generator 11 to the electrode 5 is validated by an analog gate 14. This gate is controlled by a component Vei of the vector applied to the memory element.

The memory element is erased by placing the change-over switch 9, 12 and 13 in the position Pl. In this position, the generator 6 applies a pulse with an amplitude of about 10 volts for a few microseconds to the electrode 4, and a null voltage corresponding to that of the ground circuit M is applied to the electrode 5.

The recording of the information on the memory elements of column 4$i$ is got in the following configuration:

the change-over switch 9 of the column 4$i$ is at the position P21;

the change-over switch 9 of all the other columns are at the positions P22;

the change-over switches 12 and 13 of rows 5 are at P21 or P22 depending on whether a "1" or a "−1" is to be written in the corresponding memory element.

Figure 8:
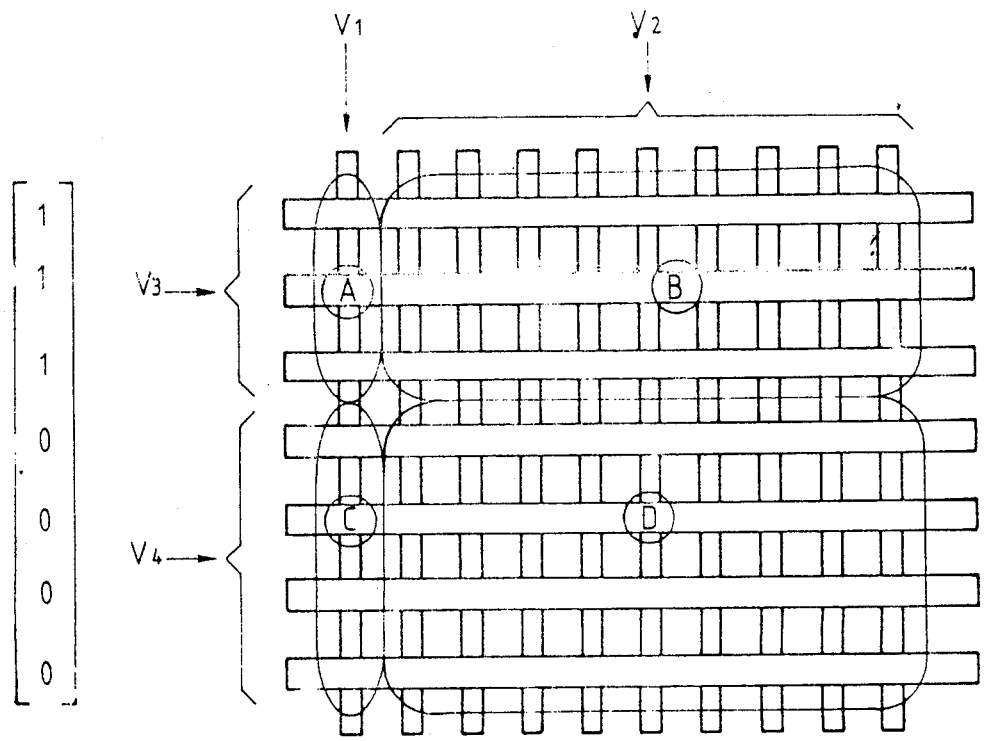
FIG. 8 is a drawing showing the method for recording the network of the invention.

The resulting operation is as follows, after writing "−1" on the entire matrix. As shown in FIG. 8, four voltage generators $V_1$, $V_2$, $V_3$ $V_4$ are used. The object of these four voltages is to provide, by the play of their combinations, for a selective updating of each column i successively without erasing the other columns.

The selective updating of each column results in the distinguishing of four types of zones in the matrix:

zone A, formed by memory elements which have to take the value 1, in the updated column;

zone C formed by memory elements, which have to take the value −1, in the updated column;

zone B formed by the other memory elements of the same rows as the memory elements of the zone A, and zone D formed by the other memory elements of the same rows as the memory elements of zone B.

In FIG. 8, the updated column is the first column, and it is charged with the values (1, 1, 1, −1, −1, −1, −1). Of course, each column is charged successively, thus causing a distribution of the zones B and D on either side of the updated column, when this column is not at one end of the matrix. Similarly, the zones Q and C of the updated column can split up into several alternating portions depending on the alternation of the values −1 and 1 for the charging of each column.

Each of the cells of the matrix has the following voltages:

| Voltage seen by the pixels | Results sought | Implying |
| --- | --- | --- |
| Zone A $VA = V_3 - V_1$ | "1" written | $V_3 - V_1 > V_c$ |
| Zone B $VB = V_3 - V_2$ | unchanged | $|V_3 - V_2| < V_c$ |
| Zone C $VC = V_4 - V_1$ | unchanged | $|V_4 - V_1| < V_c$ |

| Voltage seen by the pixels | Results sought | Implying |
|---|---|---|
| Zone D VD = V₄ − Vₐ | unchanged | $\|V_4 - V_2\| < V_c$ |

$V_c$ is the threshold voltage needed to cause the remanent polarization of the ferroelectric to flip over.

Any value that meets the constraints of the right-hand column can be taken for $V_1$, $V_2$, $V_3$ and $V_4$. For example:

$V_3 = V$
$V_1 = 0$ volts
$V_4 = \frac{1}{3} V_3$
$V_2 = \frac{2}{3} V_3$

This choice reduces the voltages seen by each pixel B, C, D, to the minimum (the pixels see $\pm \frac{1}{3} V_3$. Finally, the reading is done by placing the change-over switches 9, 12 and 13 on the position P3, the effect of which is to make a current flow through the electrode 5 if the input of the analog gate 14 is at the logic level 1. The rise in temperature at the surface 1b of the ferroelectric layer of the medium 1, generated by Joule effect in the electrode 5, produces, at the output of the reading amplifer 8, a positive or negative signal depending on the state, 1 or zero, of the signal memorized in the memory element. For example, a power value of about $24.10^3$ Watts applied for about 5 μs is generally enough to enable a satisfactory signal-to-noise ratio to be obtained.

Figure 2:
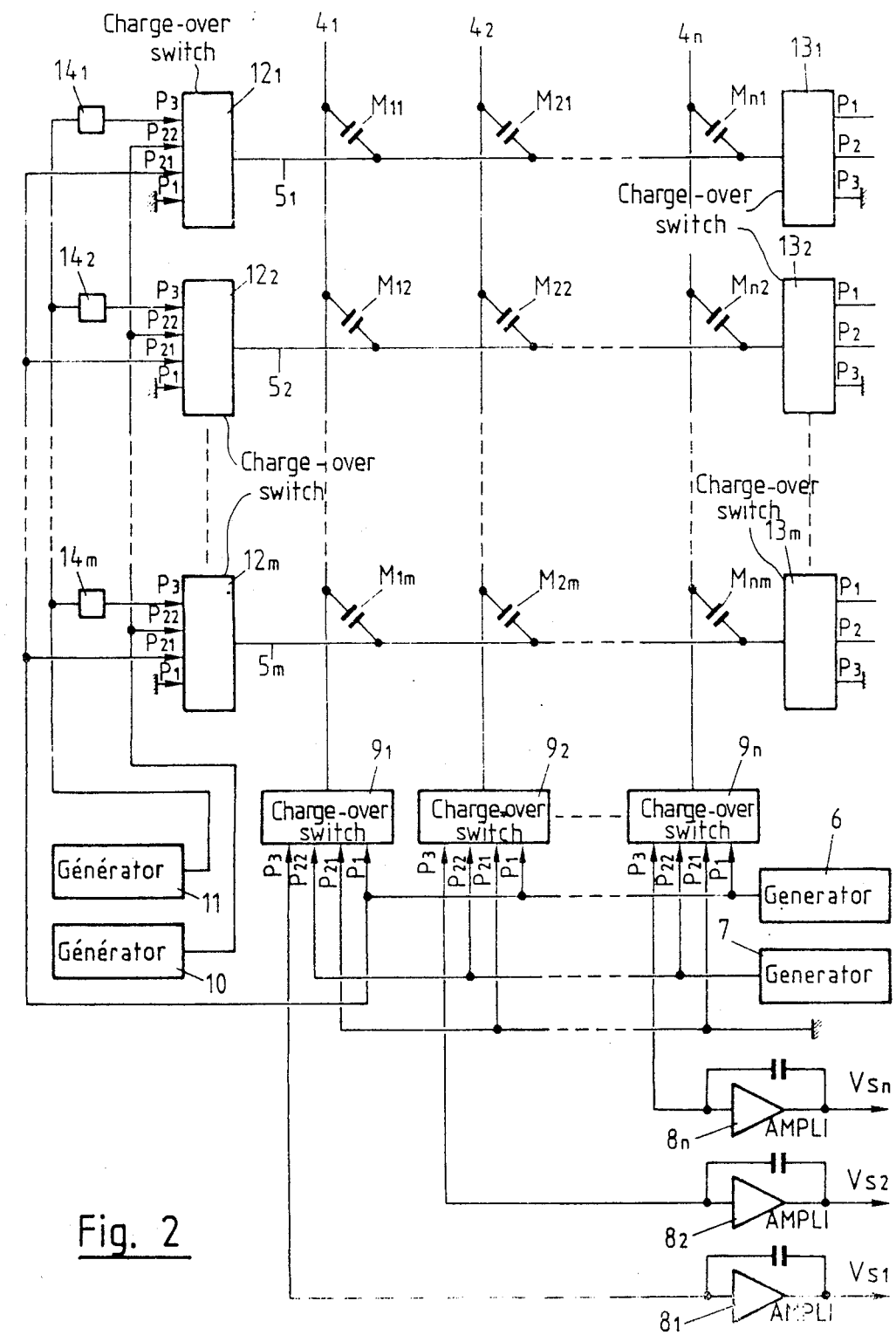
FIG. 2 shows a mode of assembling several memory elements according to FIG. 1 to form a memory plane with matrix addressing.
Figure 7:
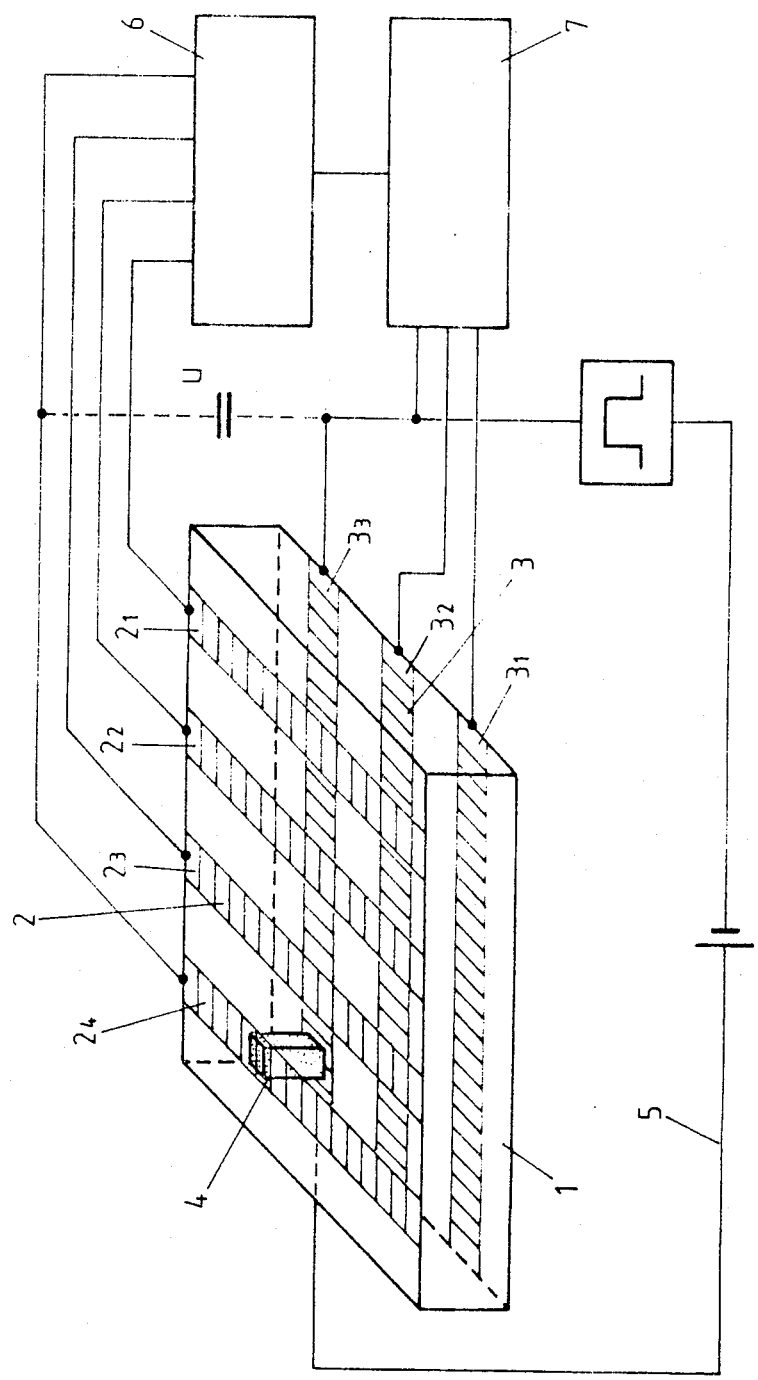
FIG. 7 shows a known embodiment of a ferroelectric memory.

The structure, just described, of a memory and connection element according to the invention has the advantage of being easily integrated into bigger assemblies to form, for example, matrix memory planes of the type shown in FIG. 2.

In this example, a matrix memory plane is made on a thin silicon wafer by an assembly of n×m memory elements $M_{ij}$ of the type described above. Each element $M_{ij}$ occupies a position in the matrix at the intersection of a column electrode $4_i$ with a row electrode $4_j$ with $1 < i < n$ and $1 < j < m$. According to this organization, each row electrode $5_j$ connects n memorizing elements through two change-over switches $12_j$ and $13_j$, and each column electrode $4_i$ connects m memorizing elements through a single change-over switch $9_i$. It is noted, in FIG. 2, that for better integration of all the elements forming the memory plane, the change-over switches $9_i$, $123_j$, $13_j$ may advantageously be replaced by change-over logic circuits which can be directly integrated into the silicon wafer.

Under these conditions, the memory plane is erased by placing all the rows $5_1$ to $5_n$ at the potential O and all the columns $4_1$ to $4_n$ at a potential V greater than a potential Vc. Vc will be about a few tens of volts for a thickness of $PVF_2$ of $10^{-6}$m and should be applied for a few μs. The uniform state thus obtained corresponds to a uniform polarization −Pr giving a positive pyroelectrical signal to the temperature rise, to which a digit value "−1" may be assigned.

In operational mode, the columns $4_1$ to $4_n$ are switched over to the charge amplifiers $8_1$ to $8_n$ and the row electrodes are switched over to the position P3 on their generator 11 through analog gates $14_1$ to $14_m$, as in FIG. 1.

The rise in temperature at the surface of the ferroelectric, generated by Joule effect in each row electrode, produces a positive signal for a digit "−1" and a negative signal for a "1". The read circuits may be designed to process one of these two signals as if it were zero, and then the usual digital signals are returned to.

The device just described has two worthwhile aspects:

firstly, the medium for memorizing the synaptic coefficients is made with ferroelectric polymer memory cells.

secondly, through the pyroelectrical effect, the synaptic connection between a row made by a component Vei of the input vector and a column giving a component Vj of the output vector is achieved by this same memory cell.

Since the read signal is formed by an electrical charge Q defined by the relationship:

$Q = \pi \Delta T$ where $\Delta T$ is the rise in temperature and $\pi$ is the pyroelectrical coefficient, there is obtained, if all the inputs $V_{ei}$ are excited at the same time, at the input of a neurone, a charge $Q_{ij}$ generated for each connection such that:

$Q_{ij} = \pi_{ij} \Delta T_i$.

On an entire column, the overall charge generated is then:

$$Q_j = \sum_{i=1}^{i=n} Q_{ij}$$

The conversion of the electrical charge $Q_j$ into a potential level Vj and a discrimination $V_{sj} = \text{sign}(V_j)$ are achieved by each column amplifier $8_j$.

$\pi_{ij}$ is proportionate to the stored remanent polarization of the point (ij). Since the polarization can vary from −Pr to +Pr, $\pi_{ij}$ may have negative, zero or positive values.

Consequently, the product $a_{ij} \cdot V_{ei}$, which is to be considered, is a product which verifies the truth table of FIG. 3. This table takes into account the fact that the ferroelectrical cubes or memory elements are always saturated in a top state or in a bottom state.

Three chief means can be envisaged to verify the truth table of the algebraic multiplication $a_{ij} \cdot V_{ei}$ of FIG. 3.

The first means, shown in FIGS. 4A and 4B, consists in duplicating each of the horizontal rows $5_i$ into two rows $5_{2i}$ and $5_{2i+1}$ so that the connection between a row $5_{2i}$, excited at the potential $V_{ei}$, and a column $4_j$ is always in the electrical state opposite to the electrical state of the connection between the row excited at the potential Vei and the column $4_j$.

If Vei = 1, the row $5_{2i}$, which is carried to the potential $V_{ei}$, is heated and the row $5_{2i+1}$, carried to the potential Vei, is not heated. A device $14_i$, for the excitation of the rows $5_{2i}$ and $5_{2i+1}$, is shown within broken lines in FIG. 4B. This device has two gates $14_{2i}$ and $14_{2i+1}$ for the excitation of the rows $5_{2i}$ and $5_{2i+1}$ by the generator 11. The gate $14_{2i}$ is directly controlled by the potential level of the signal Vei and the gate $14_{2i+1}$ is controlled by a potential level which is the reverse of the signal Vei by an amplifier 15.

A second means, shown in the diagram of FIG. 5 and the drawing of FIG. 6 makes a temporal transposition of the spatial scheme of FIGS. 4A and 4B. This transposition consists in avoiding the duplication of a memory cell in its opposite state and, in order to achieve an input Vei = −1, in shifting a pulse in time, so that, at the moment of detection, each ferroelectric cube or memory element is in a cooling stage.

According to the timing diagram of FIG. 5, the reading period t typically has the magnitude of the propagation time of the thermal wave in the ferroelectric polymer layer, namely $e^2/4D$, where e is the thickness of the ferroelectric
and D is its thermal diffusivity.

A corresponding sequencer is shown in FIG. 6. It comprises a Joule effect generator 11 to supply each row through a transistor 13. A synchronization clock (not shown) applies a synchronization signal, firstly to the inputs of two current switches 16 and 17 and, secondly, to the input of a delay device formed by two series-connected delay devices 18 and 19 with respective delays t and t'. The current switch 16 transmits the synchronization signal to the control input of the transistor 14 through a delay device 20 with a delay equal to t and the current switch 17 transmits the synchronization signal to the input of the delay device 20 through a delay device 21 with a delay of t'. The current switch 27 is controlled by the binary state, equal to +1, of the signal Vei. The current switch 14 is controlled by the binary state, equal to −1, of the signal Vei. An inverting amplifier 32 enables the inverting of the state of the signal Vei to control the switch 16.

The third means to achieve the operation:

$$\sum_{i=1}^{N} (a_{ij} V_{ei})$$

consists in transposing values $V_{ei}$. This approach avoids the duplication of each row, in maintaining the synchronization of all the input signals.

For, if we assume $V'_{ei} = \frac{1}{2}(V_{ei}+1)$:
as $V_{ei} \in \{-1, +1\}$, we get $V'_{ei} \in \{0, +1\}$,
whence:

$$\sum_i (a_{ij} V_{ei}) = 2 \left( \sum_i (a_{ij} V'_{ei}) - \frac{1}{2} \sum_i a_{ij} \right)$$

the first term of the second member directly represents the charge generated by pyroelectrical effect if:

$\pi_{ij}$ is proportionate to $a_{ij}$
$\Delta T_i$ is proportionate to $v'_{ei}$.

The second term does not depend on the input signals but solely on the synaptic coefficients of the column. This term can therefore be computed at the network recording stage. It can be stored, for example, in the form of its binary code, and it can be converted by standard analog/digital conversion means at the reading stage.

Figure 9:
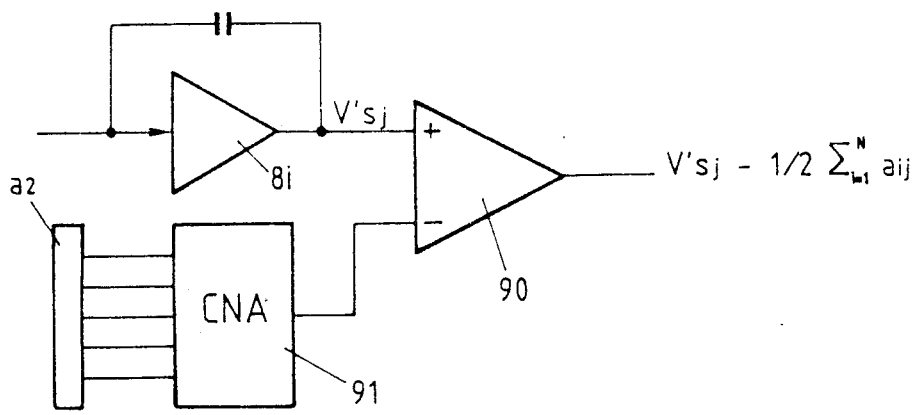
FIG. 9 is a drawing showing a specific circuit for the reading of the network.

FIG. 9 shows a circuit to implement this method, which can be series mounted with each amplifier 8$_i$ of FIG. 2. The signal V'$_{sj}$, obtained at the output of the amplifier 8$_i$ powers an input of an adder circuit 90. The other input of the adder circuit 90 is connected to the digital/analog converter 91. The digital/analog converter 91 converts the value of $\frac{1}{2}\Sigma a_{ij}$ stored in the memory 92. The output of the adder 90 finally gives the value from which V$_{sj}$ is found very simply.

What is claimed is:

1. A programmable, ferroelectric polymer neural network wherein each synapse (Mij) of the network comprises a memory element, made of a thin layer material or other ferroelectric materials, to memorize a synaptic coefficient $a_{ij}$, in the form of an electrical charge $q_{ij}$, and wherein the memory elements $a_{ij}$ of one and the same column j are connected together by one and the same conductor to enable the flow of all the electrical charges generated by pyroelectrical effect at each memory element of the network, when any part of the entire memory (Mij) of the column j is heated.

2. A network according to claim 1 wherein each memory element (Mij) comprises a recording medium consisting of a ferroelectric polymer having a first face and a second face, parallel to each other, means to apply at least one polarizing electrical field in the thickness of the medium between the first face and the second face, consisting of at least two electrodes, arranged crosswise on the first face and the second face, respectively, of the medium, and means to heat the recording medium at the intersection of the electrodes, and means to collect the electrical current due to the pyroelectric effect generated on one of the electrodes.

3. A network according to claim 2 wherein the polymer film is a P (VF$_2$ VF$_2$) copolymer containing 50% to 80% of VF$_3$.

4. A network according to claim 3 wherein the polyester film has a thickness of about $10^{-6}$m.

5. A network according to claim 4 further comprising several electrodes arranged in rows and columns in a matrix organization, respectively on the first face and the second face of the medium.

6. A network according to claim 5 wherein the row electrodes are coupled to erasing, recording and reading circuits for each of the memory elements located at the intersection of the row and column electrodes of the matrix.

7. A network according to claim 6 wherein the erasure of the memory elements is got by placing the corresponding row electrodes at the potential of 0 volts and the corresponding column electrodes at a potential V greater than a determined potential Vc>0.

8. A network according to claim 7 wherein the recording at the intersection of a row and a column is done by placing the corresponding column electrode at the potential zero and the corresponding row electrode at a potential V>0 for the determined interval of time.

9. A network according to claim 8 wherein the row electrodes are duplicated to form pairs of electrodes, the electrodes of one pair being excited by contrary electrical excitations.

10. A network according to claim 8 wherein the read circuits comprise a Joule effect generator and detection means to detect the currents produced at the column electrodes in periods when the memory elements (Mij) are heated, for a determined polarity of the read signals (Vei), and to detect the current produced at the column electrodes for the cooling period which follows the period of heating the memory elements (Mij) when the read signals (Vei) applied to the row electrodes have polarity in reverse to the previous polarity 11. A network according to claim 8 wherein the read circuits comprise means for the storage of a value ($\frac{1}{2} a_{ij}$) representing the sum of the synaptic coefficients of each column, an addition means weighted by said value with the electrical current V'$_{sj}$ generated by pyroelectrical effect on the corresponding column electrode so as to obtain a final value:

$$V_{sj} = 2\left(V'_{sj} - \frac{1}{2}\sum_i a_{ij}\right) \in \{-1, +1\}.$$

12. A network according to claim 8 wherein the recording of network is done column by column, said network further comprising means for the application, for each column (j) being recorded:

a voltage $V_1$ on the column electrode ($4_j$);

a voltage $V_2$ on all the other column electrodes ($4_1, \ldots 4_{j-1}, 4_{j+1}, \ldots 4_n$);

a voltage $v_3$ on the line electrodes $5_k$ corresponding to the memory elements ($M_{kj}$) on which it is desired to record "1";

a voltage $V_4$ on the line electrodes $5_1$ corresponding to the memory elements ($M_{1j}$) on which it is desired to record "0", it being imperative that all four voltages should be subjected to the following conditions:

$V_3 - V_1 > V_c, V_3 - V_2 < V_c, V_4 - V_i < V_c, V_4 - V_2 < V$

* * * * *

UNITED STATES PATENT AND TRADEMARK OFFICE
CERTIFICATE OF CORRECTION

PATENT NO. : 4,873,455

DATED : Oct. 10, 1989

INVENTOR(S) : Emmanuel de Chambost, et al

It is certified that error appears in the above-identified patent and that said Letters Patent is hereby corrected as shown below:

On the title page, item [22]:

The filing date is incorrectly recorded, "10/17/88", should be:

--10/07/88--

Signed and Sealed this

Eighteenth Day of September, 1990

*Attest:*

HARRY F. MANBECK, JR.

*Attesting Officer*      *Commissioner of Patents and Trademarks*